United States Patent [19]

Rich et al.

[11] Patent Number: 4,795,680

[45] Date of Patent: Jan. 3, 1989

[54] POLYIMIDE-SILOXANES, METHOD OF MAKING AND USE

[75] Inventors: Jonathan D. Rich, Rexford; Peter P. Policastro, Niskayuna; Pamela K. Hernandez, Clifton Park, all of N.Y.

[73] Assignee: General Electric Company, Schenectady, N.Y.

[21] Appl. No.: 11,185

[22] Filed: Feb. 5, 1987

Related U.S. Application Data

[63] Continuation-in-part of Ser. No. 861,162, May 9, 1986, abandoned, which is a continuation-in-part of Ser. No. 678,725, Dec. 5, 1984, abandoned.

[51] Int. Cl.$^4$ ................................................ B32B 7/00
[52] U.S. Cl. .................................... 428/450; 428/447; 437/235; 437/243; 528/26; 528/28; 528/38; 528/41; 525/431; 525/432
[58] Field of Search ...................... 528/26, 28, 38, 41; 428/447, 450; 437/235, 243; 525/432, 431

[56] References Cited

U.S. PATENT DOCUMENTS 4,011,198 3/1977 Takekoshi et al. .................... 528/41
4,017,340 4/1977 Yerman ............................. 148/33.3

OTHER PUBLICATIONS

Proceedings of the Society of Plastics Engineers, Babu, "Silicon-Modified Polyimides: Synthesis and Properties," pp. 51–66, Nov. 10–12, 1982.
Chemical Abstracts, vol. 82, No. 16 (1975) 98918W, "Polyimides from Silicon-containing Dianhydrides and Diamines."

*Primary Examiner*—Melvyn, I. Marquis
*Attorney, Agent, or Firm*—William A. Teoli; James C. Davis, Jr.; James Magee, Jr.

[57] ABSTRACT

Polyimide-siloxanes are provided resulting from the intercondensation of organic diamines with organosiloxanes having terminal silyl-substituted aromatic organic anhydride groups. Semiconductor devices and composites using such polyimidesiloxanes as dielectric or passivating layers, films, adhesives and composites are also provided.

34 Claims, 1 Drawing Sheet

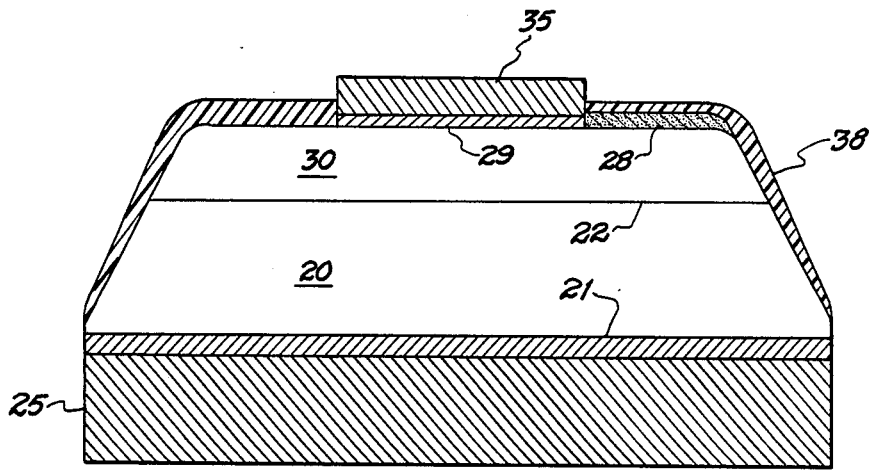

POLYIMIDE-SILOXANES, METHOD OF MAKING AND USE

CROSS REFERENCE TO RELATED APPLICATIONS

This application is a continuation-in-part of application Ser. No. 861,162, filed May 9, 1986, which is a contination-in-part of Ser. No. 678,725, filed Dec. 5, 1984, both now abandoned, which is assigned to the same assignee as the present inventor and incorporated herein by reference.

BACKGROUND OF THE INVENTION

Prior to the present invention, various methods were used to make polyimidesiloxanes consisting essentially of chemically combined blocks of polydiorganosiloxane with polyimide. Holub, U.S. Pat. No. 3,325,450 shows the intercondensation of polydiorganosiloxane having terminal diorganoorganoaminosiloxy units with benzophenone dianhydride resulting in the production of polyimide-siloxane. Another procedure involved the intercondensation of polydiorganosiloxane having terminal alkyl amino groups with aromatic bis(ether anhydride) as shown by Heath et al, U.S. Pat. No. 3,847,867. A further example of polyimidesiloxanes is shown by Ryang, U.S. Pat. No. 4,404,350, utilizing a norbornane anhydride terminated organopolysiloxane intercondensed with organic diamine and optionally other aromatic bisanhydride.

The synthesis of 1,3-bis(3,4-dicarboxyphenyl)-1,1,3,3-tetramethyl disiloxane dianhydride is shown by J. R. Pratt et al, Journal of Organic Chemistry, Vol. 38, No. 25, 1973 (4271-4274). A synthesis of the Pratt et al "siloxane anhydride", and siloxane anhydride of the formula

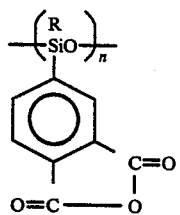

(1)

where R and n are as defined below, is application Ser. No. 765,089, filed Aug. 13, 1985, now U.S. Pat. No. 4,709,054, which is assigned to the same assignee as the present invention and incorporated herein by reference. These siloxane anhydrides can be made by effecting reaction between a functionalized disilane and an aromatic acyl halide in the presence of an effective amount of a transition metal catalyst and thereafter hydrolyzing the resulting halosilyl aromatic anhydride.

The present invention is based on the discovery that siloxane anhydride of Formula (1), aromatic anhydride terminated organopolysiloxane of the formula

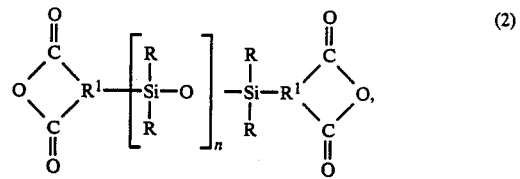

(2)

or equilibrated mixtures thereof, can be used to make polyimide-siloxane by intercondensation with organic diamine having the formula $NH_2R^2NH_2$, (3)

where R is a $C_{(1-14)}$ monovalent hydrocarbon radical or a $C_{(1-14)}$ monovalent hydrocarbon radical substituted with the same or different radicals neutral during intercondensation, $R^1$ is a $C_{(6-14)}$ trivalent aromatic organic radical, $R^2$ is a $C_{(2-20)}$ divalent organic radical, and n is an integer equal to 1 to about 2000 inclusive. In Formula (2), n also can be 5 to about 2000 inclusive.

The siloxane anhydrides of Formulas (1) and (2) and mixtures thereof also can be equilibrated with cyclopolydiorganosiloxane of the formula

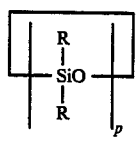

(4)

where R is as previously defined and p is an integer equal to 3 to 8 inclusive, or siloxane anhydride of Formula (1) can be equilibrated with a mixture of cyclopolydiorganosiloxane of Formula (4) and triorganosiloxane chain stopper, such as hexamethyldisiloxane. Additional chain stopper such as tetramethyldiphenyldisiloxane, 1,3-divinyltetramethyldisiloxane, or mixtures thereof also can be used.

STATEMENT OF THE INVENTION

In accordance with the present invention there is provided polyimide-siloxane having recurring chemically combined imidesiloxane groups comprising the intercondensation reaction product of (A) siloxane anhydride having chemically combined units of the formula

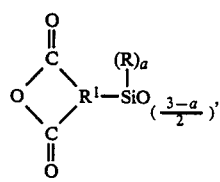

(5)

or a mixture of such siloxane anhydride units chemically combined with siloxane units of the formula,

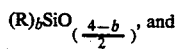, and (6)

(B) organic diamine of formula (3) where R and $R^1$ are as previously defined, a is a whole number equal to 0 to 2 inclusive and b is a whole number equal to 0 to 3 inclusive.

Preferably, the polyimide-siloxanes of the present invention are made by the intercondensation of organic diamine of formula (3) and siloxane anhydride of the formula,

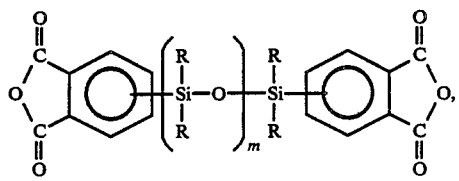 (7)

where R is as previously defined, and m is an integer equal to 1 to 3 inclusive, and most preferably 1.

In another aspect of the present invention, there is provided, polyimide-siloxane which comprise repeating chemically combined siloxane imide groups of the formual

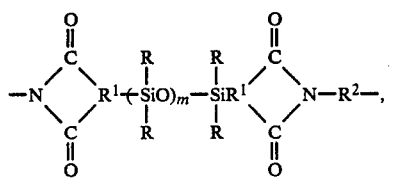 (8)

or a repeating mixture having from about 5 to 95% by weight of mixture of such siloxane imide groups and from 95% to 5% by weight of mixture of imide groups of the formula

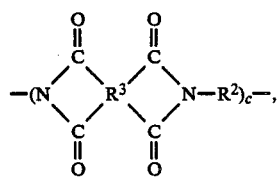 (9)

where R, $R^1$, $R^2$ and m are as previously defined, $R^3$ is a tetravalent $C_{(6-14)}$ aromatic organic radical defined below, and c is an integer equal to 1 to 200 inclusive.

In a further aspect of the present invention, there is provided polyimide-siloxane having repeating chemically combined groups of the formula

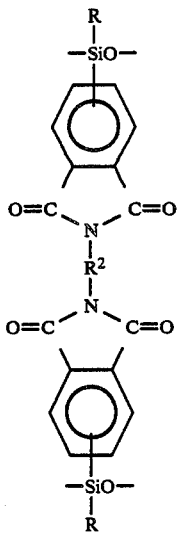 (10)

where R, $R^1$, $R^2$ are as previously defined.

Radicals included within R of Formulas (1, 2, 4–8 and 10) are for example $C_{(1-8)}$ alkyl radicals and halogenated alkyl radicals, for example, methyl, ethyl, propyl, butyl, octyl, trifluoropropyl, etc.; alkenyl radicals, for example, vinyl, allyl, cyclohexenyl, etc.; aryl radicals, alkaryl radicals, alkoxyaryl radicals, and haloaryl radicals, for example, phenyl, chlorophenyl, methoxyphenyl tolyl, xylyl, biphenyl, naphthyl, etc.;

Radicals included within $R^1$ are, for example,

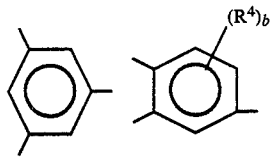

where $R^4$ are monovalent neutral radicals such as R, halo, and $C_{(1-8)}$ alkoxy, and b is an integer having a value of from 1 to 3 inclusive.

Radicals included within $R^2$ are, for example, divalent $C_{(2-20)}$ organic radicals selected from the class consisting of $C_{(6-20)}$ aromatic hydrocarbon radicals, halogenated $C_{(6-20)}$ aromatic hydrocarbon radicals, alkylene radicals, and cycloalkylene radicals, $C_{(2-8)}$ organo terminated polydiorganosiloxane, and divalent radicals included by the formula,

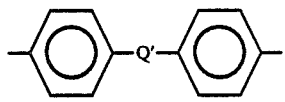

where Q' is a member selected from the class consisting of

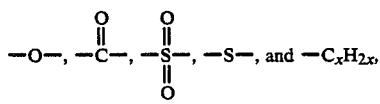

and x is a whole number from 1 to 5 inclusive.

Radicals included within R³ of Formula (9) are, for example,

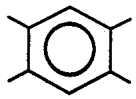

and

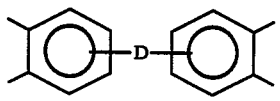

where D is a member selected from $$-O-, -S-, -\overset{O}{\underset{R^5}{\overset{\|}{C}}}\overset{O}{\underset{R^5}{\overset{\|}{N}}}\overset{O}{\underset{}{\overset{\|}{C}}}-, -\overset{O}{\overset{\|}{C}}-, -OR^6O- \text{ and } \overset{O}{\overset{\|}{C}}OR^6O\overset{O}{\overset{\|}{C}},$$

where R² is as previously defined, R⁵ is selected from hydrogen and R, R⁶ is a member selected from

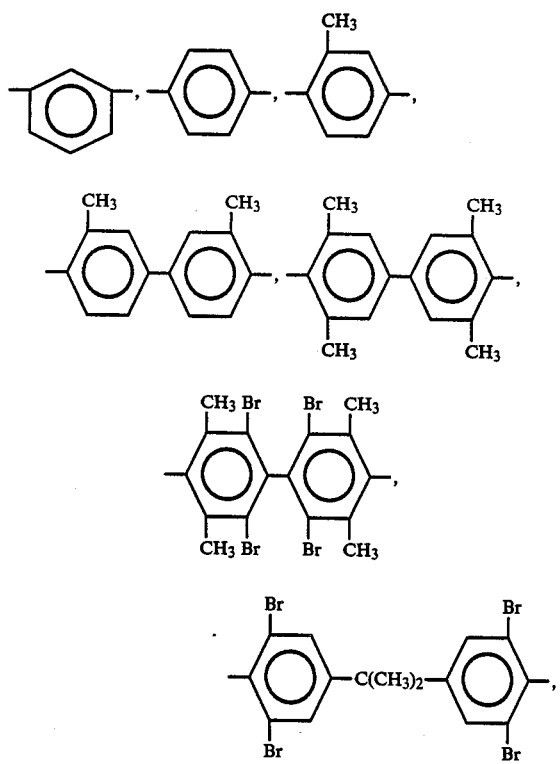

and divalent organic radicals of the general formula,

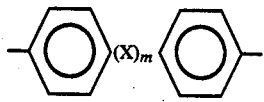

where X is a member selected from the class consisting of divalent radicals of the formulas,

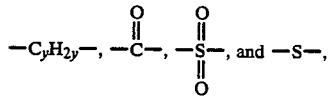

where m is 0 or 1, and y is a whole number equal to from 1 to 5.

DESCRIPTION OF THE DRAWINGS

An additional aspect of the invention is illustrated by the drawing showing a side elevation view in cross-section of an electronic device made in accordance with the invention.

There is shown more particularly, a semiconductor device comprising semiconductor material, such as silicon, silicon carbide, germanium, and gallium arsenide. The semiconductor device has two major semiconductor material regions, 20 and 30, and a P-N junction at 22.

There is further shown an electrical contact at 35, which is conductively joined to region 30 through a conductor 29, such as solder. A second electrical contact is shown at 25, wich is joined to region 20 through conductive material 21, such as solder.

An insulating coating, such as silicon dioxide, or silicon nitride, is shown at 28. A conformal coating, dielectric layer, insulating layer, or passivating layer, is shown at 38 comprising the polyimide siloxane of the present invention.

In addition to the semiconductor devices having polyimide-siloxane dielectric layers, there is also provided by the present invention, composites of polyimides, such as Kapton ® polyimide, and a metal or metalloid substrate having an intermediate layer of polyimide-siloxane as an adhesive. For example, a composite of Kapton polyimide and a metal or metalloid such as aluminum, silicon, germanium, can be made by treating either a Kapton polyimide substrate, or the metal substrate with an organic solvent solution of polyimide-siloxane comprising chemically combined units of formula (8), allowing the substrate to dry to leave a polyimide-siloxane residue thereon. The resulting treated substrate can thereafter be laminated with the other substrate to produce a polyimide-metal or metalloid composite having the polyimide-siloxane as an intermediate layer. A laminating pressure of 100 to 10,000 psi can be used at a temperature of 150° to 450° C. Solvents which can be used are, for example, anisole, p-methyanisole, xylene or diglyme.

In certain cases the composite can be formed more advantageously by initially treating the appropriate polyimide or metal substrate with polyimidesiloxane which can be applied in the form of a polyamide acid solution in a dipolar, aprotic organic solvent such as N-methylpyrollidone. Evaporation of the solvent and subsequent heating at temperatures of 200° to 500° C. can convert the polyamide acid to the polyimide state.

In a further aspect of the invention, composites also are contemplated consisting of polyimide, such as Kapton polyimide joined to polyimide, using polyimidesiloxane of the present invention as an adhesive and such polyimide-siloxanes as an insulating or adhesive coating on silicon on multilayer microelectronic structures.

Organic dianhydrides which can be used in combination with the siloxane anhydrides of Formula (1) and (2) or mixtures thereof in the practice of the present invention are, for example, aromatic organic dianhydride, such as pyromellitic dianhydride, benzophenone dianhydride, 3,3',4,4'-biphenyl tetra carboxylic anhydride, sulfonyl-bis(4-phthalic anhydride), 3,3',4,4'-diphenylsulfide tetra carboxylic anhydride, and 2,2-bis(4-phthalic anhydride) 1,1,1, 3,3,3 hexafluoropropane, aromatic bis(ether anhydride) of Heath et al., U.S. Pat. No. 3,847,867, and oxy-bis(4-phthalic anhydride). In addition, silylnorbornane anhydride as shown by Ryang, U.S. Pat. No. 4,381,396, assigned to the same assignee as the present invention also can be used.

Included within the organic diamines of formula (3) are compounds or mixtures thereof such as
3,3'-diaminobenzophenone
4,4'-diaminobenzophenone
4,4'-diaminodiphenylether;
m-phenylenediamine;
p-phenylenediamine;
4,4'-diaminodiphenylpropane;
4,4'-diaminodiphenylmethane; benzidine;
4,4'-diaminodiphenyl sulfide;
4,4'-diaminodiphenyl sulfone;
1,5-diaminonaphthalene;
3,3'-dimethylbenzidine;
3,3'-dimethoxybenzidine;
2,4-diaminotoluene;
2,6-diaminotoluene;
2,4-bis(p-amino-t-butyl)toluene;
1,3-diamino-4-isopropylbenzene;
1,2-bis(3-aminopropoxy)ethane;
m-xylylenediamine;
p-xylylenediamine;
bis(4-aminocyclohexyl)methane;
decamethylenediamine;
3-methylheptamethylenediamine;
4,4-dimethylheptamethylenediamine;
2,11-dodecanediamine;
2,2-dimethylpropylenediamine;
octamethylenediamine;
3-methoxyhexamethylenediamine;
2,5-dimethylhexamethylenediamine;
2,5-dimethylheptamethylenediamine;
3-methylheptamethylenediamine;
5-methylnonamethylenediamine;
1,4-cyclohexanediamine;
1,15-octadecanediamine;
bis(3-aminopropyl)sulfide;
N-methyl-bis(3-aminopropyl)amine;
hexamethylenediamine;
heptamethylenediamine;
nonamethylenediamine;
3,3'-diaminodiphenyl ether;
3,4'-diaminodiphenyl ether;
bis-(3-aminopropyl)tetramethyldisiloxane; etc.

The polyimide-siloxanes of the present invention can be synthesized by effecting reaction at temperatures in the range of from 150° C. to 350° C., substantially equal molar amounts of the siloxane anhydride, or a mixture of siloxane anhydride and organic dianhydride, with the organic diamine in the presence of an inert organic solvent.

Inert organic solvents which can be utilized are, for example orthodichlorobenzene, xylene, and dipolar aprotic solvent, for example, dimethylformamide, dimethylacetamide, N-methylpyrrolidone. The siloxane dianhydride of formula (2), where n is greater than 1, for example, n' having a value of from about 5 to about 2000, can be made by equilibrating the siloxane dianhydride of formula (2) where n is 1 with cyclopolysiloxanes such as hexaorganocyclotrisiloxane or octaorganocyclotetrasiloxane in the presence of a conventional equilibration catalyst.

Some of the polyimidesiloxanes can be block polymers and can be used as insulation for electrical conductors, adhesives, molding compounds, films, coatings, laminates, tough elastomers, and matrix material for composites such as glass fiber, carbon fiber, or polyaramid fiber, such as Kevlar polyamide fiber composites.

In order that those skilled in the art will be better able to practice the invention, the following examples are given by way of illustration and not by way of limitation. All parts are by weight.

EXAMPLE 1

A mixture, consisting of 20.0 grams of 1,3-bis(4-phthalic anhydride)tetramethyldisiloxane, 5.1 grams of meta-phenylenediamine and 71 ml of ortho-dichlorobenzene was heated to reflux temperature. The mixture was refluxed for 2 hours with water azeotrope constantly being removed. Material started to precipitate from solution and the heating was ceased. There was then added to the mixture, 100 ml of methylene chloride after the solution cooled and the resulting homogeneous product mixture was poured into 500 ml of rapidly stirring methanol. A white product precipitated. The procedure was repeated and additional product was obtained and the resulting product dried in vacuo. There was obtained 23.4 grams or 100% yield of material. Based on method of preparation, the product was a polyimide-siloxane consisting essentially of chemically combined units of rhe formula

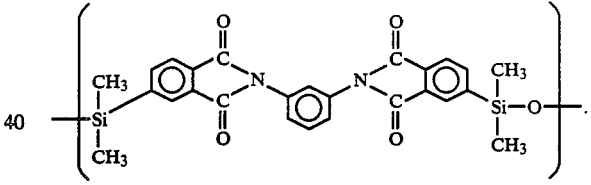

Analysis by GPC indicates the product has a molecular weight of about 75,000 g/mole. The polyimide-siloxane has a Tg of 169° C. and an IV in chloroform of 0.76 dL/g. A valuable insulating coating is formed on a copper wire when the wire is dipped into a 10% solution of the polymer in chloroform and allowed to air dry.

EXAMPLE 2

A mixture of 5 grams of 1,3-bis(4'-phthalic anhydride)tetramethyldisiloxane and 20.84 grams of octamethylcyclotetrasiloxane in 50 ml of orthodichlorobenzene containing 0.5 ml of fuming sulfuric acid and 1.0 ml of concentrated sulfuric acid was heated to 110° C. for 18 hours. The mixture was allowed to cool to room temperature and 100 ml of methylene chloride was added and an excess of sodium bicarbonate was introduced to neutralize the acid. The solution was filtered with decolorizing carbon and the solvent removed in vacuo. The product was then heated to 80° C. under high vacuum 0.01 torr to remove any volatile products. There was obtained a clear viscous oil which was a polydimethylsiloxane having an average of about 16 chemically combined dimethylsiloxy units with terminal dimethyl silicon anhydridesiloxy units. Based on method of preparation and proton NMR and IR analysis, the product had the following formula,

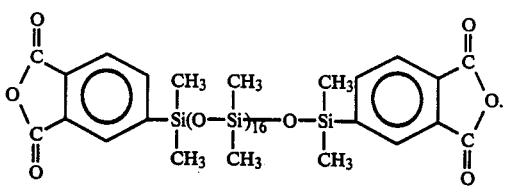

EXAMPLE 3

A mixture of 50 ml of toluene, 7 grams of bis (phthalic anhydride)tetramethyldisiloxane, 29 grams of octamethylcyclotetrasiloxane and 75 μl of a fluoromethane sulfonic anhydride and 26 μl of water was heated to 67°. After 48 hours, the resulting homogeneous solution was cooled to room temperature and the acid neutralized with 300 milligrams of anhydrous magnesium oxide. Approximately 100 ml of methylene chloride was introduced into the mixture and the solution was filtered using decolorizing carbon. The mixture was stripped of solvent in vacuo and the resulting viscous oil was heated to 80° C. under 0.01 torr vacuum to remove any volatile cyclosiloxanes. No sublimation of phthalic anhydride was observed, indicating that equilibration occurred without end group cleavage. There was obtained 21.4 grams of a clear viscous oil representing 59% of isolated yield. Based on method of preparation, proton NMR, and infrared analysis the product was a polydimethylsiloxane having an average of 27 chemically combined dimethylsiloxy units and terminal dimethylsiloxy phthalic anhydride siloxy units.

A mixture of 5 grams of the above equilibrated siloxane dianhydride, 4 grams of 1,3-bis(4'-phthalic anhydride)tetramethyldisiloxane and 1.24 grams of metaphenylene diamine was heated to reflux in 30 ml of orthodichlorobenzene in the presence of a catalytic amount of 4-dimethylaminopyridine. Water was formed during the reaction, and it was removed continuously during the 2 hour heating period. After cooling, an additional 75 ml of methylene chloride was added to the mixture to redissolve precipitated product. The mixture was then poured into methanol and product was precipitated twice, separated and then dried. There was obtained 2 grams of a product which was dissolved in 10 ml of chloroform. There was obtained a 10 mil transparent thermoplastic elastomeric film when the product was cast. Based on method of preparation, the product was a polyimide-siloxane consisting essentially of chemically combined units of the formula

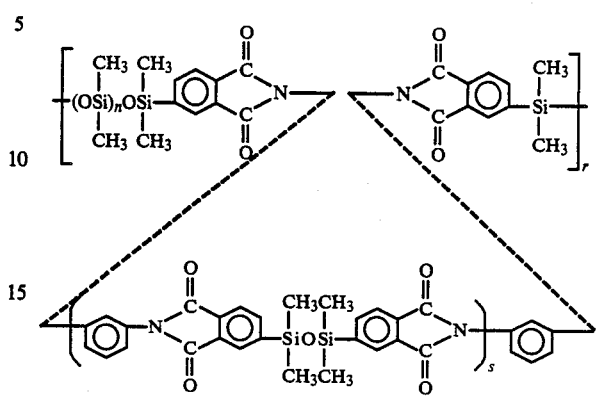

where r and s are positive integers within the definition of n as previously defined. GPC analysis established that the polyimide-siloxane had a molecular weight of about 173,000 g/mole and an IV of 1.2 dL/g in chloroform. It was found that the polyimide-siloxane could be readily extruded onto copper wire and exhibited valuable insulating and dielectric properties.

EXAMPLE 4

A mixture containing 5 grams of the equilibrated siloxane dianhydride described in Example 3, 1.7 grams of benzophenone dianhydride, and 1.24 grams of m-phenylenediamine were heated to reflux in 30 ml of o-dichlorobenzene in the presence of a catalytic amount of 4-dimethylaminopyridine. Water was removed continuously during the two hour heating period. A product was isolated in a manner similar to that described in Example 3. Based on the method of preparation the product was a polyimide-siloxane consisting essentially of chemically combined units of the formula

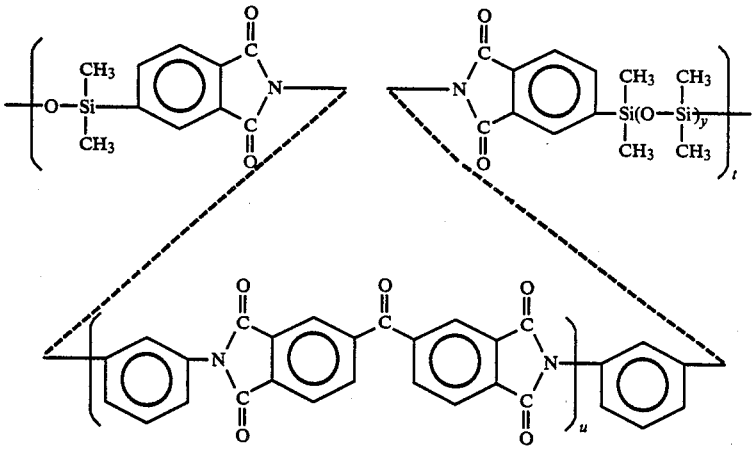

where t and u are as defined for r and s in Example 3.

EXAMPLE 5

To 25 ml of a methylene chloride solution containing 0.5 grams of 4-dichloromethylsilylphthalic anhydride was added a 5 fold molar excess of water. After drying and removal of the solvent in vacuo, there was obtained a quantitative yield of a methyl siloxane having pendant silylphthalic anhydride groups within the scope of Formula 1, as shown by NMR and IR analysis. The methylsiloxane was added to 5 grams of a polydimethylsiloxane fluid having terminal dimethylsiloxy phthalic anhydride units and an average of 27 chemically combined dimethylsiloxy units. The mixture was dissolved in 50 ml of toluene and 2 drops of concentrated sulfuric acid was then added. The resulting solution was heated for 4 hours at 80° C. After cooling, 50 ml of methylene chloride was added and the solution neutralized with sodium bicarbonate, followed by drying and removal of the solvent in vacuo. To the resulting silicone fluid was added 0.5 grams of m-phenylenediamine and the mixture heated to remove water. The resulting cross-linked polymer was a tough rubber with valuable insulating and dielectric properties.

EXAMPLE 6

There was heated to 75° C., a 50 ml toluene solution of 3.0 g of 4-phthalicanhydride-methylsiloxane of Example 5, 3.0 g of octamethylcyclotetrasiloxane, and 6 mg of hexameth yldisiloxane as a chain terminator. A catalytic amount of Nafion acidic resin was introduced and the mixture heated to 75° C. for 15 hours. Filtration of the catalyst and removal of the toluene solvent in vacuo gave a trimethylsiloxy terminated copolymer containing dimethylsiloxy and 4-phthalicanhydride, methylsiloxy units. NMR and infrared analysis were consistent with the copolymer structure. The polymer was readily cross-linked with a polyamine such as gamma aminopropyltetramethyldisiloxane to produce a tough cross-linked thermoplastic silicone elastomer.

EXAMPLE 7

A mixture of 30 gm (0.11 mole) of hexachlorodisilane and 23 gm (0.11 moles) of trimellitic anhydride acid chloride is reacted at 145° C. under a nitrogen atmosphere in the presence of 1 mole palladium (11) on silica gel. Carbon monoxide is evolved and tetrachlorosilane is removed continuously as it forms. Vacuum distillation of the resulting mixture is found to provide 4-trichlorosilylphthalic anhydride.

Hydrolysis of the 4-trichlorosilylphthalic anhydride provides a cross-linked resin having the formula

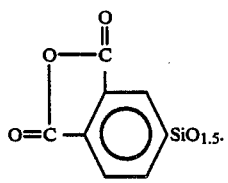

A mixture of 4-trichlorosilylphthalic anhydride and dimethyldichlorosilane is cohydrolyzed in water to produce a silicone fluid. The silicone fluid consists essentially of chemically combined siloxyphthalic anhydride units chemically combined with dimethylsiloxy units. A cured polyimide-siloxane is formed by intercondensing the silicone fluid with γ-aminopropyltetramethyldisiloxane.

EXAMPLE 8

A series of polyimidesiloxanes were prepared from various organic dianhydrides, siloxane dianhydrides, and mixtures thereof, with different aromatic organic diamines, siloxanediamines, and mixtures thereof, to determine the thermal stability and primerless adhesion of the siloxaneimides to silicon. The dianhydrides used in preparing the imidesiloxanes were pyromellitic dianhydride (PMDA), oxy-bis(4-phthalicanhydride)(ODAN), 1,2-bis(4-phthalicanhydride)-1,1,2,2-tetramethyldisiloxane(PADS) and 2,2-bis(4-)3,4-dicarboxyphenoxy(phenyl[propanedianhydride]BPADA). The aromatic organic diamines used in preparing the imide siloxanes were 4,4'-oxydianiline(ODA), methylenedianiline(MDA), and a polydimethylsiloxane having an average of about 8 chemically combined polydimethylsiloxy units and terminal ε-aminopropyldimethylsiloxy units (GAP). A mixture of toluenediamine (TDA) and G$_9$GAP, an aminopropyl-terminated polydimethylsiloxane having 9 chemically combined dimethylsiloxy units, was also used as a source of the organic diamine.

The imidesiloxanes were prepared by stirring under a nitrogen atmosphere equal molar amounts of dianhydride and diamines with sufficient dimethylacetamide or N-methylpyrrolidone to provide a solution having a solid concentration of between 15-30% by weight. The resulting polyamideacid was stirred for at least 2-3 hours at room temperature.

In determining thermal stability, the polyamideacid solution was cast on a Pyrex glass plate. The resulting film was heated at 70° C. under partial vacuum with a nitrogen bleed for about 12 hours. The film was then heated on a hot plate in a nitrogen atmosphere of 100° C. for 2 hours, 150° C. for 2 hours, 200° C. for 1.5 hours, 300° C. for 1 hour, and 450° C. for 30 minutes. Thermal stability was determined by calculating the percent weight loss- of the polyimide film scraped from the glass plate from its initial weight following the 450° C. heating for 30 minutes to its final weight after a second 450° C. heating for 30 minutes.

The adhesive qualities of the imide siloxane was a determined by filtering a 1½ ml amide-acid solution through a 0.5 micron filter. In applying the resulting filtered solution to a clean 4" diameter silicon wafer, the treated wafer was spun at 5000 rpm for 25 seconds and was then heated at 100° C. overnight, 2 hours at 250° C., and 1 hour at 300° C. The cured wafers were scored to produce a 1 millimeter×1 millimeter grid pattern. The adhesion test used was rapidly peeling off 3M710 tape at a 90° angle from the scored wafer surface. The failure of the test means that the treated squares or a portion thereof were removed by the tape. The following results were obtained:

| Dianhydride (MOLES) | Diamine (MOLES) | % wt loss* 450° C. | Tape peel test** |
|---|---|---|---|
| PMDA | ODA | 0.6 | Fail |
| PMDA/PADS (7:3) | ODA (10) | 0.8 | Pass |
| ODAN | ODA | 0.5 | Fail |
| ODAN/PADS | ODA | 0.9 | Pass |
| PMDA/PADS (7:3) | ODA (10) | 0.6 | Pass |
| PMDA/PADS (7:3) | ODA | 0.6 | Pass |
| PADS | ODA | 2.0 | Pass |
| BPADA (10) | MDA/GAP (7:3) | 6.0 | Pass |
| BPADA (10) | TDA/G$_9$GAP (7:3) | 18.4 | Pass |

*% Δ weight over 2nd 30-minute interval under nitrogen
**Silicon substrate: samples were boiled in water 1 hour before testing The above results show that imidesiloxane made in accordance with the practice of the present invention using (PADS) siloxanedianhydride of Formula (7) or mixtures thereof with other organic dianhydrides provide both significantly improved thermal stability and primerless adhesion, as compared to imidesiloxane free of such siloxanedianhydride.

Although the above examples are directed to only a few of the very many variables which can be utilized in making the polyimide-siloxanes of the present invention, it should be understood that the present invention is directed to a much broader variety of polyimide-siloxanes which can be made by effecting reaction between siloxane anhydride and organic diamine as shown in the description preceding these examples.

What we claim as new and desire to secure by Letters Patent of the United States is:

1. Polyimide-siloxane comprising repeat groups selected from the class consisting of,

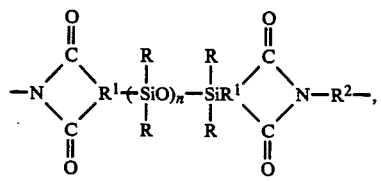

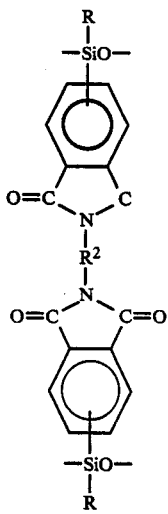

a mixture thereof, and mixtures of such groups with imide groups of the formula

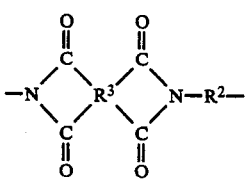

wherein R is selected from the class consisting of $C_{(1-14)}$ monovalent hydrocarbon radicals and $C_{(1-14)}$ monovalent hydrocarbon radicals substituted with radicals neutral during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organoterminated polydiorganosiloxane, $R^3$ is a tetravalent $C_{(1-14)}$ aromatic organic radical, and n is an integer equal to 5 to about 2000 inclusive.

2. Polyimide-siloxane having recurring chemically combined imide-siloxane groups comprising the anhydride-amine intercondensation reaction product of
    (A) a mixture of anhydrides comprising
        (i) organic dianhydride, and
        (ii) siloxane anhydride having chemically-combined units of the formula,

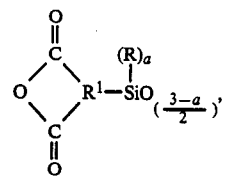

or such siloxane anhydride units chemically-combined with siloxane units of the formula,

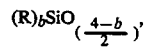

intercondensed with
    (B) diamine of the formula, $NH_2R^2NH_2$, where R is a member selected from the class consisting of $C_{(1-14)}$ monovalent hydrocarbon radicals and $C_{(1-14)}$ monovalent hydrocarbon radical substituted with radicals neutral during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organo terminated polydiorganosiloxane radical, a is a whole number equal to 0 to 2 inclusive, and b is a whole number equal to 0 to 3 inclusive.

3. Polyimide-siloxane in accordance with claim 2, which comprises by weight, from 5% to 95% of siloxane-imide repeat groups of the formula,

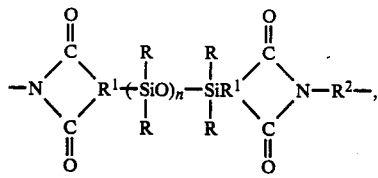

chemically-combined with 95% to 5% of imide groups of the formula,

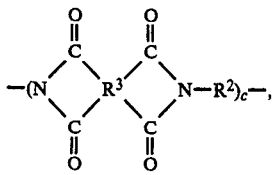

where R is a member selected from the class consisting of $C_{(1-14)}$ monovalent hydrocarbon radicals and $C_{(1-14)}$ monovalent hydrocarbon radicals substituted with radicals neutral during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organo terminated polydiorganosiloxane radical, $R^3$ is a tetravalent $C_{(6-14)}$ aromatic organic radical, c is an integer equal to 1 to 200 inclusive, and n is an integer equal to 1 to about 2,000 inclusive.

4. Polyimide siloxane in accordance with claim 2, where the siloxane anhydride has the formula,

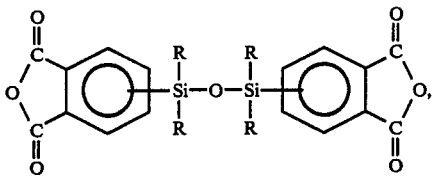

where R is a C$_{(1-14)}$ monovalent hydrocarbon radical or a C$_{(1-14)}$ monovalent hydrocarbon radical substituted with the same or different radicals neutral during intercondensation.

5. Polyimide-siloxane in accordance with claim 2, where the siloxane anhydride is

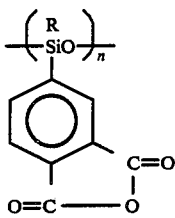

R is a member selected from the class consisting of C$_{(1-14)}$ monovalent hydrocarbon radicals, and C$_{(1-14)}$ monovalent hydrocarbon radicals substituted with radicals neutral during intercondensation, and n is an integer equal to about 1 to about 2,000 inclusive.

6. Polyimide-siloxane in accordance with claim 2, where the siloxane anhydride is

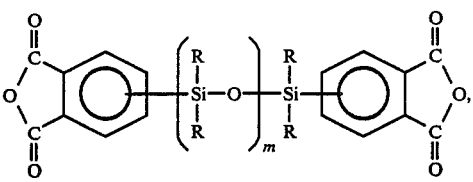

R is a member selected from the class consisting of C$_{(1-14)}$ monovalent hydrocarbon radicals and C$_{(1-14)}$ monovalent hydrocarbon radicals substituted with radicals neutral during intercondensation, and m is an integer equal to 1 to 3 inclusive.

7. Polyimide-siloxane in accordance with claim 2, where the organic anhydride is an aromatic bis(etheranhydride).

8. Polyimide-siloxane in accordance with claim 2, where the organic dianhydride is 2,2-bis[4-(3,4-dicarboxyphenoxy)phenyl]propane dianhydride.

9. Polyimide-siloxane in accordance with claim 2, where the organic dianhydride is pyromellitic dianhydride.

10. Polyimide-siloxane in accordance with claim 2, where the organic dianhydride is benzophenone dianhydride.

11. Polyimide-siloxane in accordance with claim 2, where the organic dianhydride is oxy-bis-(4-phthalic anhydride).

12. Polyimide-siloxane in accordance with claim 2, where the organic dianhydride is 5,5'-(1,1,3,3-tetramethyl-1,3-disiloxanediyl)-bisnorbornane-2,3 -dicarboxylicanhydride.

13. Polyimide-siloxane in accordance with claim 2, where the diamine is p-phenylene diamine.

14. Polyimide-siloxane in accordance with claim 2, where the diamine is 4,4?-oxydianiline.

15. Polyimide-siloxane in accordance with claim 2, where the diamine is m-phenylene diamine.

16. Polyimide-siloxane comprising chemically-combined siloxane-imide repeat groups of the formula,

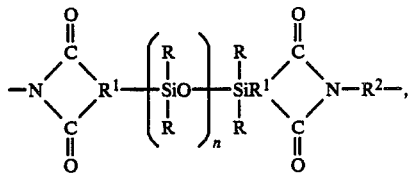

where R is selected from the class consisting of C$_{(1-14)}$ monovalent hydrocarbon radicals and C$_{(1-14)}$ monovalent hydrocarbon radicals substituted with radicals neutral during intercondensation, R$^1$ is a C$_{(6-14)}$ trivalent aromatic organic radical, R$^2$ is a member selected from the class consisting of a C$_{(2-20)}$ divalent organic radical and a C$_{(2-8)}$ organo-terminated polydiorganosiloxane radical, and n is an integer equal to 5 to about 2000 inclusive.

17. Polyamideacid-siloxane comprising chemically-combined units resulting from the intercondensation of substantially equal molar amounts of amine and anhydride from a mixture of organic dianhydride, siloxane anhydride of the formula,

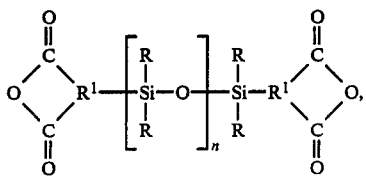

and diamine of the formula,

NH$_2$R$^2$NH$_2$, where R is a member selected from the class consisting of C$_{(1-14)}$ monovalent hydrocarbon radicals and C$_{(1-14)}$ monovalent hydrocarbon radicals substituted with the same or different radicals neutral during intercondensation, R$^1$ is a C$_{(6-14)}$ trivalent aromatic organic radical, R$^2$ is a member selected from the class consisting of a C$_{(2-20)}$ divalent organic radical and a C$_{(2-8)}$ organo terminated polydiorganosiloxane radical, and n is an integer equal to 5 to about 2,000 inclusive.

18. Polyamideacid-siloxane comprising the intercondensation reaction product of substantially equal molar amounts of amine and anhydride resulting from agitating a mixture or organic dianhydride, and siloxane anhydride of the formula,

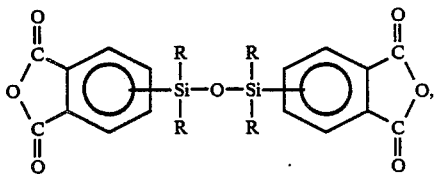

with diamine of the formula,

NH$_2$R$^2$NH$_2$, in the presence of an organic solvent, where R is a member selected from the class consisting of $C_{(1-14)}$ monovalent hydrocarbon radicals and $C_{(1-14)}$ monovalent hydrocarbon radicals substituted with radicals neutral during intercondensation, and $R^2$ is a member selected from the class consisting of a $C_{(2-20)}$ divalent organic radical and a $C_{(2-8)}$ organo terminated polydiorganosiloxane radical.

19. Polyamide acid-siloxane of claim 17, where the organic dianhydride is bisphenol-A dianhydride.

20. Polyamideacid-siloxane of claim 17, where the organic dianhydride is benzophenone dianhydride.

21. Polyamideacid-siloxane of claim 17, where the organic dianhydride is oxybisphthalic anhydride.

22. Polyamideacid-siloxane of claim 17, where the organic dianhydride is pyromellitic dianhydride.

23. A composite comprising a polyimide layer and a metal layer and an intermediate layer of polyimide siloxane comprising the intercondensation reaction product of (A) siloxane anhydride having chemically combined units of the formula,

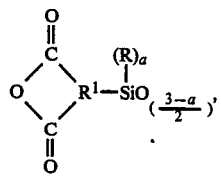

and or a mixture of such siloxane anhydride units chemically combined with siloxane units of the formula,

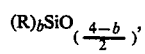

(B) organic diamine of the formula, $NH_2R^2NH_2$, where R is a $C_{(1-14)}$ monovalent hydrocarbon radical or a $C_{(1-14)}$ monovalent hydrocarbon radical substituted with the same or different radicals neutral during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organo terminated polydiorgano siloxane radical, a is a whole number equal to 0 to 2 inclusive, and b is a whole number equal to 0 to 3 inclusive.

24. A composite comprising glass fiber, carbon fiber, or polyamide fiber and the polyimide siloxane of claim 2.

25. A composite comprising glass fiber, carbon fiber, or polyamide fiber and the polyimide-siloxane of claim 16.

26. A polyimide-siloxane film in accordance with claim 2.

27. A polyimide-siloxane film in accordance with claim 16.

28. A semiconductor device having a layer of a polyimide-siloxane having recurring chemically combined imidesiloxane groups comprising the intercondensation reaction product of (A) siloxane anhydride having chemically combined units of the formula,

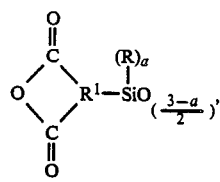

or a mixture of such siloxane anhydride units chemically combined with siloxane units of the formula

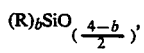

(B) organic diamine of the formula, $NH_2R^2NH_2$, where R is a $C_{(1-14)}$ monovalent hydrocarbon radical or a $C_{(1-14)}$ monovalent hydrocarbon radical substituted with the same or different radicals neutral during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organo terminated polydiorgano siloxane radical, a is a whole number equal to 0 to 2 inclusive, and b is a whole number equal to 0 to 3 inclusive.

29. A semiconductor device having as a dielectric layer, a polyimide-siloxane comprising chemically combined siloxaneimide repeat groups of the formula,

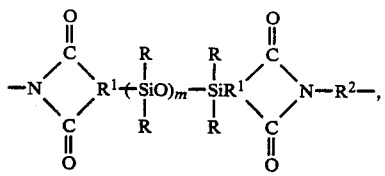

or a mixture of such siloxaneimide repeat groups and imide groups of the formula,

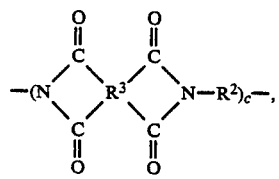

where R is selected from the class consisting of a $C_{(1-14)}$ monovalent hydrocarbon radical and a $C_{(1-14)}$ monovalent hydrocarbon radical substituted with radicals inert during intercondensation, $R^1$ is a $C_{(6-14)}$ trivalent aromatic organic radical, $R^2$ is a member selected from the class consisting of a $C_{(2-20)}$ divalent organic radical and a $C_{(2-8)}$ organo terminated polydiorgano siloxane radical, $R^3$ is a tetravalent $C_{(6-13)}$ aromatic organic radical, c is an integer equal to 1 to 200 inclusive, and m is an integer equal to 1 to about 3 inclusive.

30. A semiconductor device in accordance with claim 29, where the polyimide-siloxane layer comprises the intercondensation reaction product of 1,3-bis(3,4-dicarboxyphenyl)-1, 3,3-tetramethyldisiloxane dianhydride and 4,440-diaminodiphenylether.

31. A semiconductor device in accordance with claim 29, resulting from the intercondensation of a mixture of 1,3-bis(3,4-dicarboxyphenyl)-1,1,3,3-tetramethyldisiloxane dianhydride and oxy-bis(4-phthalicanhydride) and 4,4-diaminodiphenylether.

32. A semiconductor device in accordance with claim 29, resulting from the intercondensation product of a mixture of 1,3-bis(3,4-dicarboxyphenyl)-1,1,3,3-tetramethyldisiloxane dianhydride, pyromellitic dianhydride and a mixture of para and meta phenylene diamine.

33. A semiconductor device in accordance with claim 29 resulting from the intercondensation product of 1,3-bis(3,4-dicarboxyphenyl)-1,1,3,3-tetramethyldisiloxane dianhydride, benzophenone tetracarboxylic acid anhydride and a mixture of para and meta phenylene diamine.

34. A semiconductor device in accordance with claim 29 resulting from the intercondensation product of 1,3-bis(3,4-dicarboxyphenyl)-1,1,3,3-tetramethyldisiloxane dianhydride, oxy-bis(4-phthalicanhydride) and mixture of para and meta phenylene diamine.

* * * * *